United States Patent
Jeong et al.

(10) Patent No.: US 10,761,626 B2
(45) Date of Patent: Sep. 1, 2020

(54) TOUCH SENSOR AND MANUFACTURING METHOD THEREOF, AND DISPLAY DEVICE INCLUDING THE SAME

(71) Applicant: Samsung Display Co., Ltd., Yongin-si, Gyeonggi-do (KR)

(72) Inventors: Jae Woo Jeong, Suwon-si (KR); In Cheol Ko, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 138 days.

(21) Appl. No.: 15/953,047

(22) Filed: Apr. 13, 2018

(65) Prior Publication Data
US 2019/0129525 A1    May 2, 2019

(30) Foreign Application Priority Data
Oct. 26, 2017   (KR) .................. 10-2017-0140364

(51) Int. Cl.
| G06F 3/041 | (2006.01) |
| H01L 27/32 | (2006.01) |
| G06F 3/044 | (2006.01) |

(52) U.S. Cl.
CPC ............ *G06F 3/041* (2013.01); *G06F 3/0445* (2019.05); *G06F 3/0446* (2019.05); *H01L 27/323* (2013.01); *G06F 2203/04103* (2013.01); *G06F 2203/04112* (2013.01)

(58) Field of Classification Search
CPC ...... G06F 3/041; G06F 3/0445; G06F 3/0446; G06F 2203/04112; G06F 2203/04103; H01L 27/323
See application file for complete search history.

(56) References Cited

U.S. PATENT DOCUMENTS

| 2009/0085885 | A1* | 4/2009 | Wu ...................... G06F 3/0416 345/173 |
| 2013/0341651 | A1* | 12/2013 | Kim ................... H01L 31/0232 257/84 |
| 2014/0307178 | A1* | 10/2014 | Tang ...................... G06F 3/044 349/12 |
| 2014/0327842 | A1* | 11/2014 | Tang ...................... G06F 3/044 349/12 |
| 2015/0220204 | A1* | 8/2015 | Noguchi ................ G06F 3/044 345/174 |
| 2015/0261332 | A1* | 9/2015 | Nakamura ............ G06F 3/0412 345/173 |
| 2016/0011448 | A1* | 1/2016 | Watanabe ......... G02F 1/133528 345/174 |

(Continued)

FOREIGN PATENT DOCUMENTS

| KR | 10-2008-0004798 A | 1/2008 |
| KR | 10-2015-0006228 A | 1/2015 |

(Continued)

*Primary Examiner* — Grant Sitta
(74) *Attorney, Agent, or Firm* — Innovation Counsel LLP

(57) ABSTRACT

A touch sensor according to an exemplary embodiment includes: a substrate; a first sense electrode that is disposed on the substrate and extends in a first direction; a first insulation layer that covers the substrate and the first sense electrode; and a second sense electrode that is disposed in the first insulation layer and extends in a second direction that crosses the first direction, wherein an upper surface of the second sense electrode is disposed on the same plane as an upper surface of the first insulation layer.

12 Claims, 13 Drawing Sheets

(56) References Cited

U.S. PATENT DOCUMENTS

| | | | |
|---|---|---|---|
| 2016/0103526 A1* | 4/2016 | Sohn | G06F 3/044 |
| | | | 345/174 |
| 2016/0103549 A1* | 4/2016 | Lee | G06F 3/0412 |
| | | | 345/173 |
| 2016/0291723 A1* | 10/2016 | Kurasawa | G06F 3/0412 |
| 2016/0303843 A1* | 10/2016 | Jang | B32B 37/0084 |
| 2017/0024040 A1* | 1/2017 | Nakayama | G06F 3/044 |
| 2017/0115818 A1* | 4/2017 | Cai | G06F 3/0412 |
| 2017/0123559 A1* | 5/2017 | Yang | G06F 3/0416 |
| 2017/0139513 A1* | 5/2017 | Hong | G02B 26/005 |
| 2017/0199594 A1* | 7/2017 | Lee | G06F 3/044 |
| 2017/0365654 A1* | 12/2017 | Park | H01L 51/5237 |
| 2018/0052551 A1* | 2/2018 | Chang | G06F 3/0418 |

FOREIGN PATENT DOCUMENTS

| | | |
|---|---|---|
| KR | 10-1540803 | 7/2015 |
| KR | 10-2017-0010181 A | 1/2017 |

\* cited by examiner

TOUCH SENSOR AND MANUFACTURING METHOD THEREOF, AND DISPLAY DEVICE INCLUDING THE SAME

CROSS-REFERENCE TO RELATED APPLICATION

This application claims priority to and the benefit of Korean Patent Application No. 10-2017-0140364 filed in the Korean Intellectual Property Office on Oct. 26, 2017, the entire contents of which are incorporated herein by reference.

BACKGROUND

1. Field

The present disclosure relates to a touch sensor, a method for manufacturing the touch sensor, and a display device including the touch sensor.

2. Description of the Related Art

As an input device of a display device, a touch sensor through which a user inputs information by contacting a screen using a finger or a pen has been applied. Among various sense methods of the touch sensor, a capacitive type of touch sensor senses a location where capacitance is changed according to contact at two separated electrodes.

In order to implement a flexible display device, a display device needs to be thin so that the touch sensor is embedded in the display device. Such an embedded type of touch sensor does not include its own substrate, and sense electrodes are directly formed on one of constituent elements of the display device.

The above information disclosed in this Background section is only for enhancement of understanding of the background of the disclosure and therefore it may contain information that does not form the prior art that is already known in this country to a person of ordinary skill in the art.

SUMMARY

Exemplary embodiments have been made in an effort to provide a touch sensor that can prevent sense electrodes from being viewed, a method for manufacturing the touch sensor, and a display device including the touch sensor.

A touch sensor according to an exemplary embodiment includes: a substrate; a first sense electrode that is disposed on the substrate and extends in a first direction; a first insulation layer that covers the substrate and the first sense electrode; and a second sense electrode that is disposed in the first insulation layer and extends in a second direction that crosses the first direction, wherein an upper surface of the second sense electrode is disposed on a same plane as an upper surface of the first insulation layer.

The touch sensor may further include a second insulation layer that covers the first insulation layer and the second sense electrode.

A thickness of the first insulation layer may be greater than a sum of a thickness of the first sense electrode and a thickness of the second sense electrode.

The first sense electrode and the second sense electrode may include a plurality of first conductive lines and a plurality of second conductive lines that are respectively connected with each other such that a mesh shape is formed, and upper surfaces of the plurality of second conductive lines may be disposed on the same plane as the upper surface of the first insulation layer.

An upper portion of the first insulation layer may include a plurality of grooves, and a plurality of second conductive line may fill the grooves.

The touch sensor may further include an overcoat that is disposed between the substrate and the first insulation layer, and a plurality of second conductive lines may not contact the overcoat.

A method for manufacturing a touch sensor according to an exemplary embodiment includes: forming a first sense electrode as a first metal layer on a substrate; forming a first insulation layer that covers the first sense electrode on the substrate; forming a photosensitive film on the first insulation layer and patterning the photosensitive film; forming a plurality of grooves on an upper surface of the first insulation layer by using the photosensitive film as a mask; forming a second metal layer on the photosensitive film and forming a second sense electrode by filling the grooves with the second metal layer; and removing the photosensitive film.

The method for manufacturing the touch sensor may further include forming an overcoat between the substrate and the first insulation layer, wherein the grooves may not expose the overcoat.

A thickness of the photosensitive film may be smaller than a thickness of the first insulation layer.

The thickness of the first insulation layer may be greater than a sum of a thickness of the first sense electrode and a thickness of the second sense electrode.

The grooves may expose the overcoat.

A thickness of the photosensitive film may be greater than a thickness of the first insulation layer.

The thickness of the first insulation layer may be a same thickness as that of the second sense electrode.

The method for manufacturing the touch sensor may further include forming a second insulation layer on the first insulation layer.

Further, a display device according to an exemplary embodiment includes: a display panel configured to display an image; and a touch sensor that is disposed on the display panel, wherein the touch sensor includes: a first sense electrode that is disposed on the display panel and extends in a first direction, a first insulation layer that covers the substrate and the first sense electrode, and a second sense electrode that is disposed on the first insulation layer and extends in a second direction that crosses the first direction, and an upper surface of the second sense electrode is disposed on a same plane as an upper surface of the first insulation layer.

The display panel may further include a second insulation layer that covers the first insulation layer and the second sense electrode.

A thickness of the first insulation layer may be greater than a sum of a thickness of the first sense electrode and a thickness of the second sense electrode.

The first sense electrode and the second sense electrode may respectively include a plurality of first conductive lines and a plurality of second conductive lines that are respectively connected with each other such that a mesh shape is formed, and upper surfaces of the plurality of second conductive lines may be disposed on a same plane as the upper surface of the first insulation layer.

The upper surface of the first insulation layer may include a plurality of grooves, and a plurality of second conductive lines may fill the grooves.

The display panel may include: a display substrate; a light emitting member that is disposed on the display substrate; and a thin film encapsulation layer that covers the light emitting member, and the touch sensor may be disposed on the thin film encapsulation layer.

According to the exemplary embodiments, a failure that causes the sense electrodes to be viewed can be prevented.

DETAILED DESCRIPTION OF THE EMBODIMENTS

Figure 1:
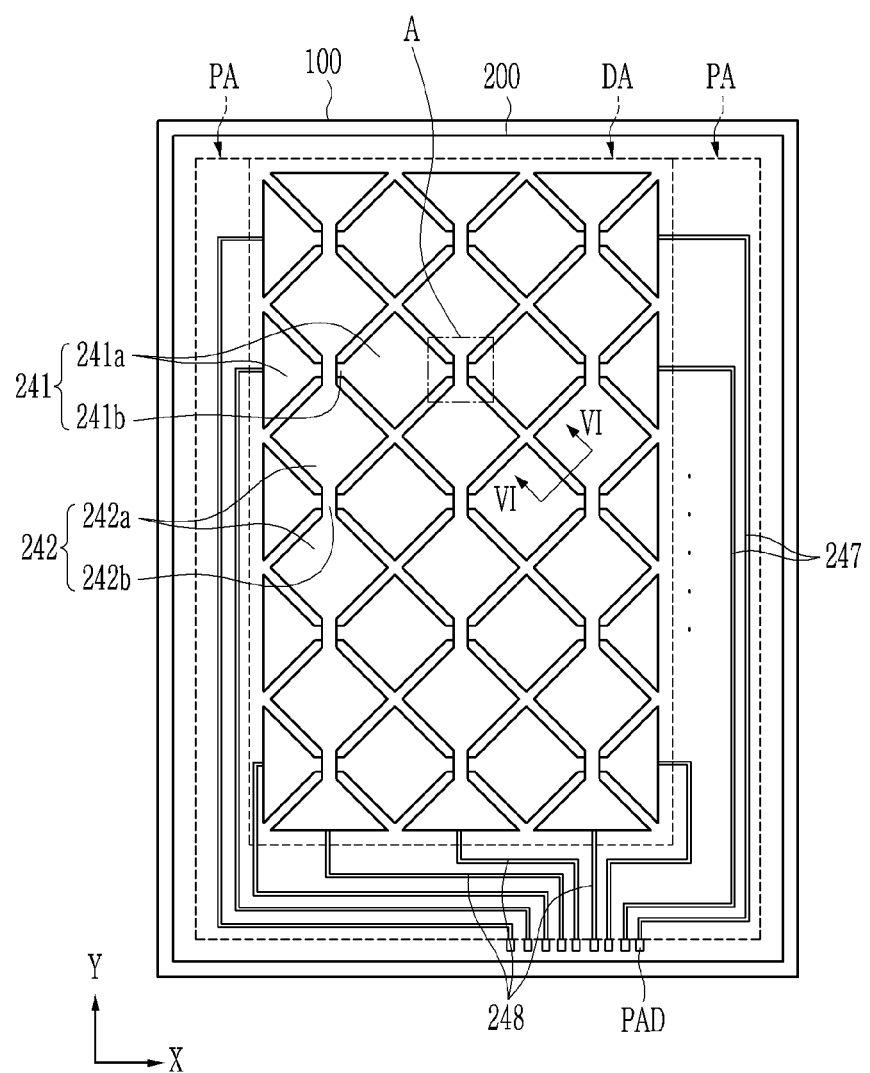
FIG. 1 is a schematic top plan view of a display device according to an exemplary embodiment.

Hereinafter, exemplary embodiments of the present disclosure will be described in more detail with reference to the accompanying drawings. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present disclosure is not limited thereto. In the drawings, the thickness of layers, films, panels, regions, etc., are exaggerated for clarity. In the drawings, for understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element, and will be necessarily not be understood to only be positioned "at an upper side" based on a direction opposite a gravity direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, a display device according to an exemplary embodiment will be described in detail with reference to the accompanying drawings.

FIG. 1 is a schematic top plan view of a display device according to an exemplary embodiment.

As shown in FIG. 1, a display device according to an exemplary embodiment includes a display panel 100 that displays an image and a touch sensor 200 that is disposed on the display panel 100. The display panel 100 may be applied to an organic light emitting display device. However, this is not restrictive, and the display device may be applied to various types of display devices.

The display panel 100 may include a display area DA and a peripheral area PA disposed outside the display area DA. The display area DA may include a plurality of pixels, and an image may be output from the display area DA. The peripheral area PA may be disposed at one side of the display area DA. In FIG. 1, the peripheral area PA surrounds at least part of the display area DA, but this is not restrictive. Thus, the arrangement of the display area DA and the peripheral area PA may be changed as necessary.

The touch sensor 200 may include sense electrodes 241 and 242 that are disposed in the display area DA, and connection wires 247 and 248 that are disposed in the peripheral area PA. In the present exemplary embodiment, the sense electrodes 241 and 242 are disposed in the display area DA, but this is not restrictive. The sense electrodes 241 and 242 may extend to the peripheral area PA. In this case, the sense electrodes 241 and 242 may be utilized as a controller for controlling the display device.

The sense electrodes 241 and 242 may include a first sense electrode 241 extending in a first direction X and a second sense electrode 242 extending in a second direction Y that crosses the first direction X. The connection wires 247 and 248 may include a first connection wire 247 that is connected with the first sense electrode 241 and a second connection wire 248 that is connected with the second sense electrode 242.

In this case, the first sense electrode 241 and the second sense electrode 242 sense a touch of a user using a capacitive-type method, and may include a mutual-capacitive type or a self-capacitive type.

As shown in FIG. 1, the first sense electrode 241 may include a plurality of first sense cells 241a, each substantially having a rhombus shape, and a plurality of first connection portions 241b that extend along the first direction X and connect the plurality of first sense cells 241a to each other. The first sense electrode 241 may be a receiver (Rx) touch electrode to which a first touch signal for sensing a coordinate value in the second direction Y is transmitted.

The second sense electrode 242 may include a plurality of second sense cells 242a, each substantially having a rhombus shape, and a plurality of second connection portions 242b that extend in the second direction Y and connect the plurality of second sense cells 242a to each other. The second sense electrode 242 may be a transmitter (Tx) touch electrode to which a second touch signal for sensing a coordinate value in the first direction X is transmitted.

In the present exemplary embodiment, the first sense cell 241a and the second sense cell 242a are illustrated with the shape of a rhombus, but this is not restrictive. They may have various shapes. In addition, in the present exemplary embodiment, the first sense electrode 241 is an Rx touch electrode and the second sense electrode 242 is a Tx touch electrode, but this is not restrictive. The first sense electrode 241 may be a Tx touch electrode and the second sense electrode 242 may be an Rx touch electrode.

Each of the first and second sense electrodes 241 and 242 may be respectively connected to a pad portion PAD through the first connection wires 247 and the second connection wires 248. The pad portion PAD is connected to a controller (not shown), and thus may transmit the first touch signal and the second touch signal to the sense electrodes 241 and 242.

The first sense electrode 241 and the second sense electrode 242 are disposed apart from each other by a predetermined gap, and capacitance may be formed between the first sense electrode 241 and the second sense electrode 242. When a touch is made by a user, capacitance formed between the first sense electrode 241 and the second sense electrode 242 is changed, and the controller (not shown) recognizes the capacitance change and senses a touch location.

On a plane view, the first sense cell 241a and the second sense cell 242a neighbor each other, and the first connection portion 241a and the second connection portion 242b cross each other but they may be insulated from each other by an additional insulation layer.

The first sense electrode 241 and the second sense electrode 242 may include a low-resistive metal such as silver (Ag), aluminum (Al), copper (Cu), chromium (Cr), nickel (Ni), and the like, or a conductive nano-material such as a silver nanowire, a carbon nanotube, and the like. The sense electrodes 241 and 242 have low resistance so that RC delay can be reduced, and they have excellent flexibility so that cracks may not be easily formed even through deformation such as when bending is iteratively performed.

Figure 2:
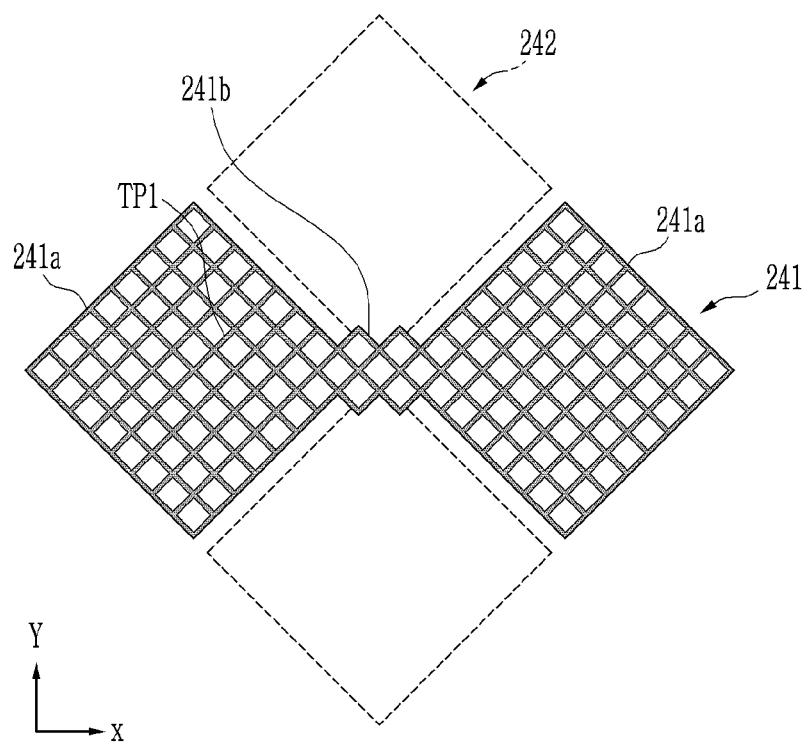
FIG. 2 is a partial top plan view of a first sense electrode of FIG. 1.
Figure 3:
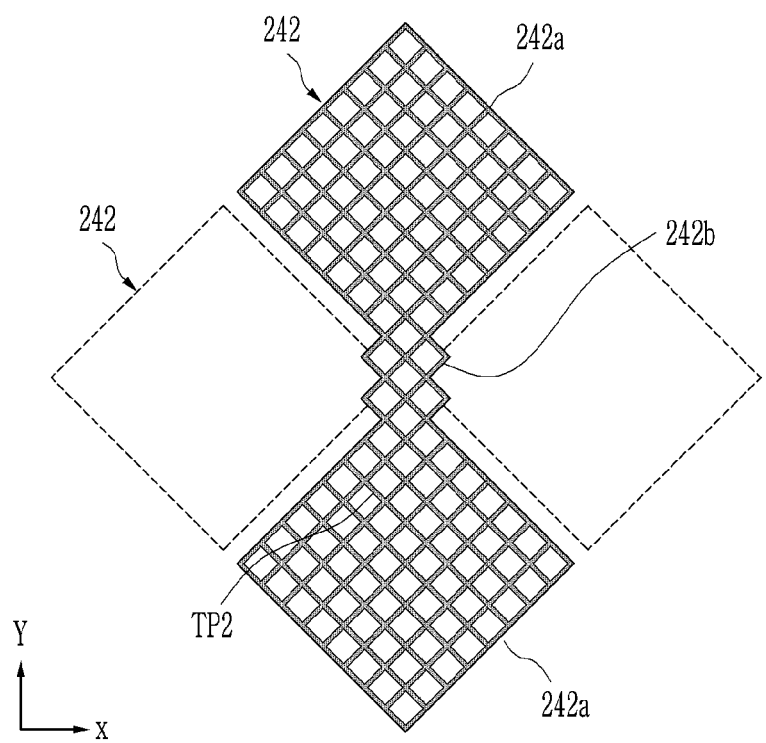
FIG. 3 is a partial top plan view of a second sense electrode of FIG. 1.

FIG. 2 is a partial top plan view of the first sense electrode of FIG. 1, and FIG. 3 is a partial top plan view of the second sense electrode of FIG. 1.

Figure 4:
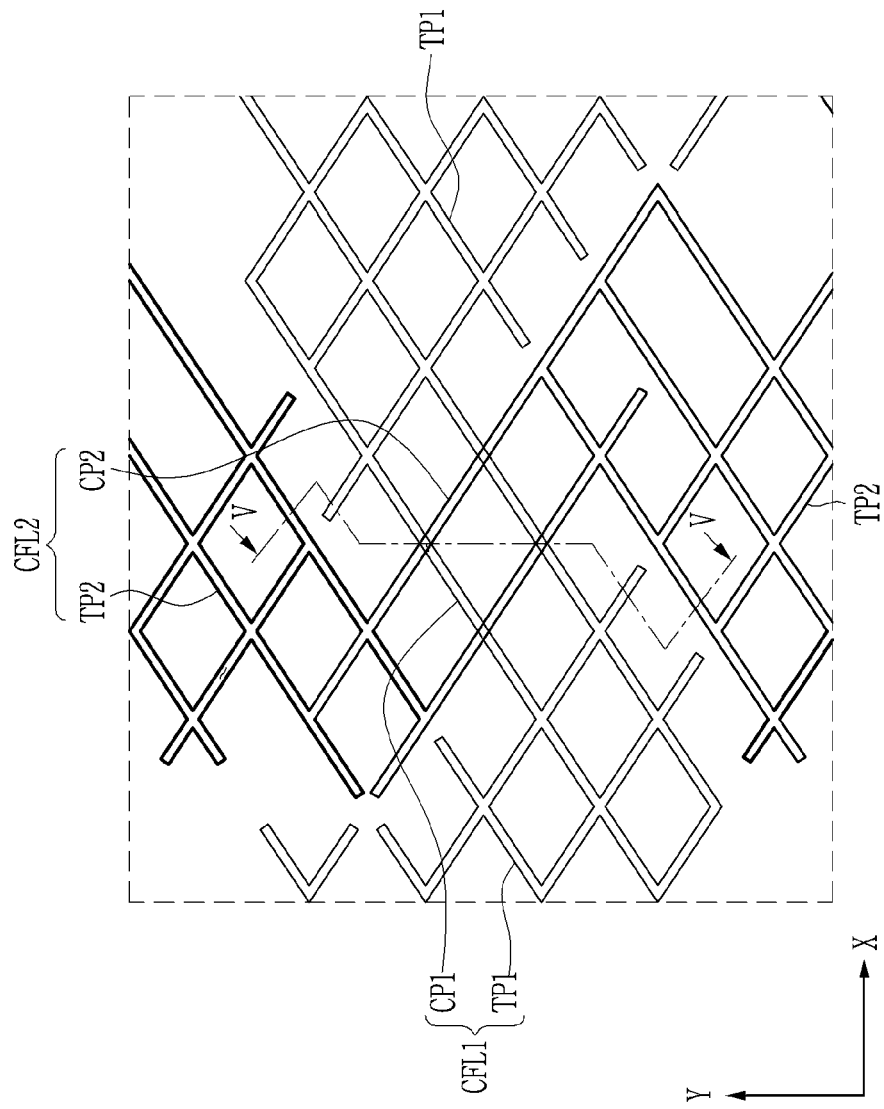
FIG. 4 is an enlarged top plan view of the portion A of FIG. 1.
Figure 5:
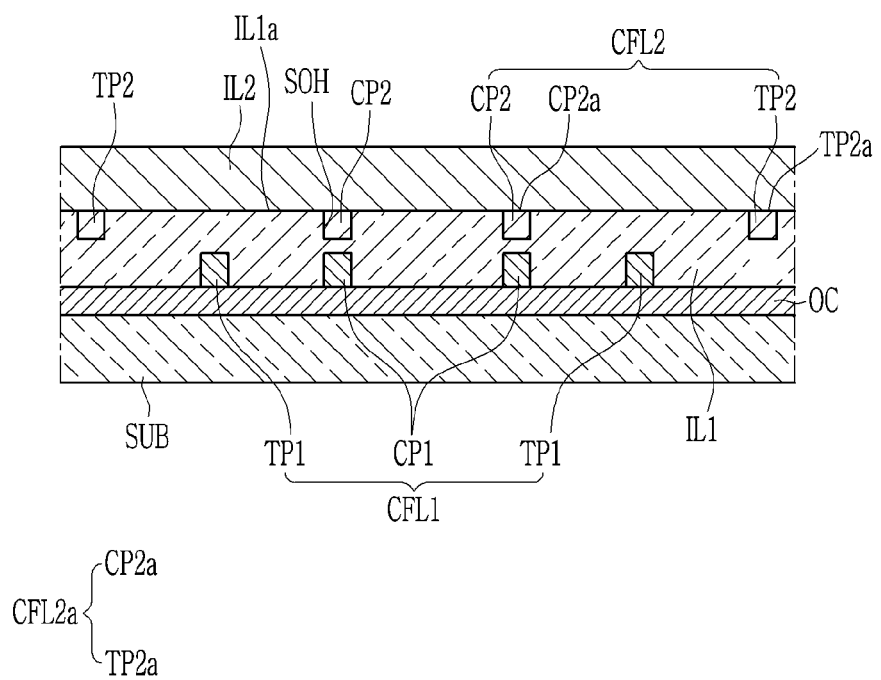
FIG. 5 is a partial cross-sectional view of a touch sensor according to the exemplary embodiment, taken along the line V-V of FIG. 4.

In FIG. 4 and FIG. 5, the first sense electrode 241 and the second sense electrode 242 may respectively include a plurality of first conductive lines CFL1 and a plurality of second conductive lines CFL2.

As described, the first sense electrode 241 and the second sense electrode 242 are respectively formed of the plurality of first conductive lines CFL1 and the plurality of second conductive lines CFL2 such that a mesh shape is formed, light emitted from the display panel 100 is not blocked, and the area where the display panel 100 is overlapped with the sense electrodes 241 and 242 is reduced, thereby minimized parasitic capacitance.

In addition, the touch sensor 200 uses the display panel 100 as a support plate rather than having a support plate of its own. Thus, the entire thickness of the touch sensor 200 becomes very thin so that the touch sensor 200 is advantageous for reducing the thickness of the display device and is appropriate for a flexible display device.

Figure 6:
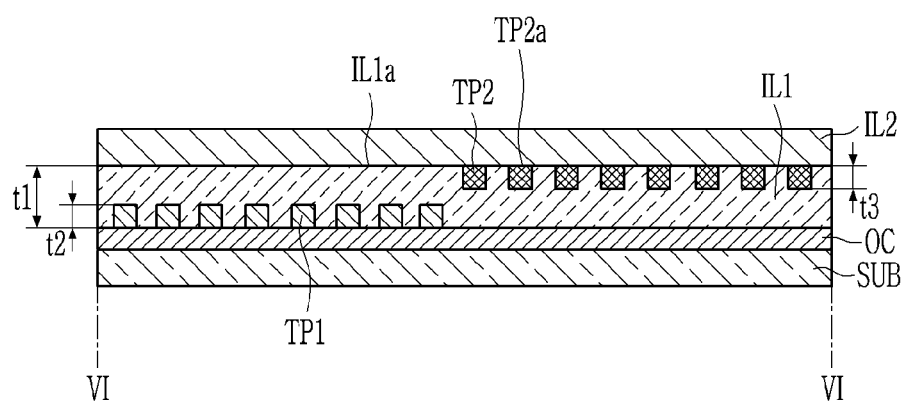
FIG. 6 is a partial cross-sectional view of the touch sensor according to the exemplary embodiment, taken along the line VI-VI of FIG. 1.

FIG. 4 is an enlarged top plan view of the portion A of FIG. 1, FIG. 5 is a partial cross-sectional view of the touch sensor according to an exemplary embodiment, taken along the line V-V of FIG. 4, and FIG. 6 is a partial cross-sectional view of the touch sensor according to the exemplary embodiment, taken along the line VI-VI of FIG. 1.

As shown in FIG. 4, the first conductive lines CFL1 forming the first sense electrode 241 may include a first sense conductive line TP1 that forms the first sense cell 241a and a second connection conductive line CP1 that forms the first connection portion 241b. In addition, the second conductive lines CFL2 that form the second sense electrode 242 may include a second sense conductive line TP2 that forms the second sense cell 242a and a second connection conductive line CP2 that forms the second connection portion 242b.

In this case, the first connection conductive line CP1 and the second connection conductive line CP2 may cross each other.

As shown in FIG. 5 and FIG. 6, an overcoat OC is disposed on a substrate SUB. The substrate SUB may be an additional layer or the topmost layer of the display panel 100. The overcoat OC may be formed of an inorganic material. The first conductive line CFL1 that includes the first sense conductive line TP1 and the first connection conductive line CP1 may be disposed on the overcoat OC. The first conductive line CFL1 may include a metal or a transparent conductive material such as a silver nanowire (AgNW), an indium tin oxide (ITO), or an indium zinc oxide (IZO). A first insulation layer IL1 may be disposed on the overcoat OC and the first conductive line CFL1. The first insulation layer IL1 may include an inorganic material. In this case, the inorganic material may include at least one selected from an aluminum oxide, a titanium oxide, a silicon oxide, a silicon oxynitride, a zirconium oxide, a hafnium oxide, and a combination thereof.

A plurality of grooves SOH are provided in an upper portion of the first insulation layer IL1, and the second conductive lines CFL2 that include the second sense conductive line TP2 and the second connection conductive line CP2 may be disposed on the upper portion of the first insulation layer IL1 while filling the grooves SOH. Such grooves SOH do not completely penetrate the first insulation layer IL1, and thus the overcoat OC is not exposed. Accordingly, the second conductive line CFL2 does not contact the overcoat OC.

In this case, an upper side IL1a of the first insulation layer IL1 may be disposed on the same plane as an upper side CFL2a of the second conductive line CFL2. Thus, the upper side IL1a of the first insulation layer IL1 may be disposed on the same plane as an upper side TP2a of the second sense conductive line TP2 and the upper side CP2a of the second connection conductive line CP2.

Thus, a distance of light incident from the outside that reaches the first conductive line CFL1 becomes similar to a distance of light incident from the outside that reaches the second conductive line CFL2. Accordingly, the first sense electrode 241 and the second sense electrode 242 are viewed from the outside, that is, a defect occurs.

At this time, a thickness t1 of the first insulation layer IL1 may be greater than the sum of a thickness t2 of the first conductive line CFL1 and a thickness t3 of the second conductive line CFL2.

That is, the thickness of the first insulation layer IL1 may be greater than the sum of a thickness of the first sense electrode 241 and a thickness of the second sense electrode 242.

In addition, a second insulation layer IL2 that covers the first insulation layer IL1 and the second conductive line CFL2 may be disposed on the first insulation layer IL1 and the second conductive line CFL2. The second insulation layer IL2 may include an inorganic material. In this case, the inorganic material may include at least one selected from an aluminum oxide, a titanium oxide, a silicon oxide, a silicon oxynitride, a zirconium oxide, a hafnium oxide, and a combination thereof.

Figure 7:
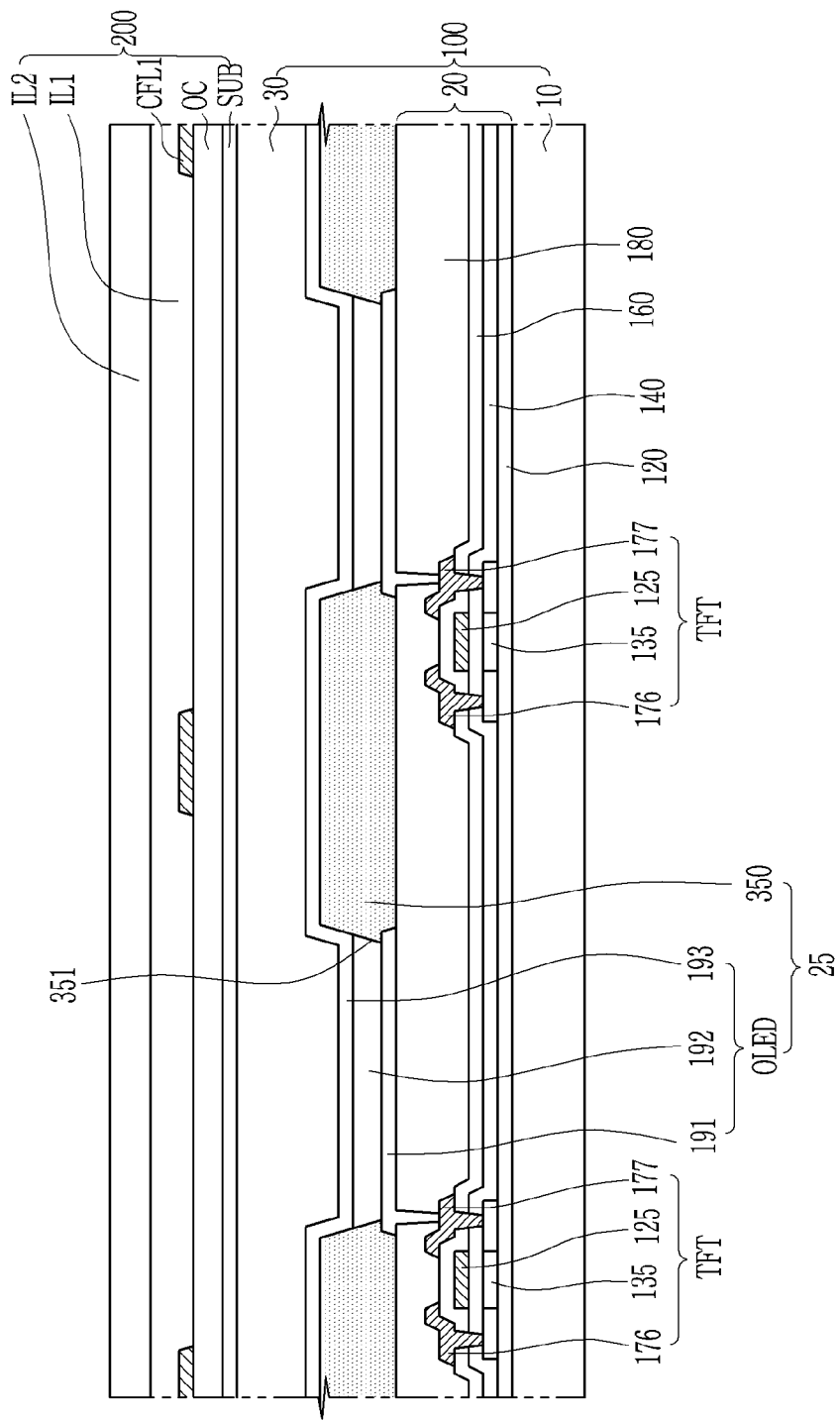
FIG. 7 is a cross-sectional view of a display device including a touch sensor according to an exemplary embodiment.

FIG. 7 is a cross-sectional view of a display device that includes the touch sensor according to the exemplary embodiment.

Hereinafter, a lamination structure of a display device according to the present exemplary embodiment will be described with reference to FIG. 7.

As shown in FIG. 7, a display device according to the present exemplary embodiment may include a display panel 100 and a touch sensor 200 disposed on the display panel 100.

The display panel 100 may include a display substrate 10, a switch 20 that is disposed on the display substrate 10, a light emitting member 25 that is disposed on the switch 20, and a thin film encapsulation layer 30 that covers the light emitting member 25. In this case, the touch sensor 200 may be directly formed on the thin film encapsulation layer 30.

The display substrate 10 may be an insulation substrate made of glass, quartz, ceramic, plastic, and the like, or a metallic substrate made of stainless steel and the like.

The switch 20 may include a buffer layer 120, a semiconductor 135, a gate insulation layer 140, a gate electrode 125, an interlayer insulation layer 160, a source electrode 176, a drain electrode 177, and a planarization layer 180, which are sequentially laminated on the display substrate 10. However, the switch is not limited thereto, and may be variously modified.

The buffer layer 120 improves characteristics of polysilicon by blocking permeation of an impurity into the display substrate 10 during a crystallization process for forming the polysilicon. In addition, the buffer layer 120 serves to release a stress of the semiconductor 135 formed on the buffer layer 120 by planarizing the display substrate 10. Such a buffer layer 120 may be made of a silicon nitride (SiNx) or a silicon oxide ($SIO_x$).

The semiconductor 135 may be disposed on the buffer layer 120 of a display area DA. Such a semiconductor 135 may be made of polysilicon or an oxide semiconductor. The semiconductor 135 includes a channel region, and a source region and a drain region that are disposed at opposite sides of the channel region and doped with an impurity. The gate insulation layer 140 may be disposed on the semiconductor 135, and the gate electrode 125 may be disposed on the gate insulation layer 140. The gate electrode 125 overlaps the channel region of the semiconductor 135. The gate insulation layer 140 may be made of a silicon nitride (SiNx) or a silicon oxide ($SiO_x$).

The interlayer insulation layer 160 may be disposed on the gate electrode 125, and the source electrode 176 and the drain electrode 177 may be disposed on the interlayer insulation layer 160. The source electrode 176 and the drain electrode 177 are respectively connected with the source region and the drain region of the semiconductor 135 through contact holes formed in the interlayer insulation layer 160 and the gate insulation layer 140. A thin film transistor (TFT) shown in FIG. 7 is a driving thin film transistor, and may be covered by the planarization layer 180.

The light emitting member 25 may include organic light emitting diodes (OLED) disposed on the planarization layer 180, and a pixel defining layer 350 that separates the organic light emitting diodes (OLED) from each other.

The organic light emitting diodes (OLED) may include a first electrode 191, an emission layer 192, and a second electrode 193 that are sequentially disposed on the planarization layer 180.

Specifically, the first electrode 191 is disposed on the planarization layer 180. The first electrode 191 is formed in each pixel, and is connected with the drain electrode 177 of the driving thin film transistor TFT through a via hole formed in the planarization layer 180. The pixel defining layer 350 is disposed on the planarization layer 180 and the first electrode 191.

The pixel defining layer 350 forms an opening 351 to expose a center portion of the first electrode 191 on which the emission layer 192 is to be positioned.

The emission layer 192 is disposed on the first electrode 191, and the second electrode 193 is disposed on the emission layer 192 and the pixel defining layer 350. The second electrode 193 is formed throughout the display panel 100 without distinction of the pixel locations. One of the first electrode 191 and the second electrode 193 injects holes to the emission layer 192 and the other injects electrons to the emission layer 192. An electron and a hole are coupled with each other in the emission layer 192 to generate an exciton, and light is emitted by energy generated when the exciton falls from an excited state to a ground state. The first electrode 191, the emission layer 192, and the second electrode 193 together form an organic light emitting diode (OLED). The first electrode 191 may be provided as a reflective layer, and the second electrode 193 may be provided as a transparent layer or a semi-transparent layer. Light emitted from the emission layer 192 is reflected by the first electrode 191, and passes through the second electrode 193 and is thus emitted to the outside. In this case, when the second electrode 193 is provided as a semi-transparent layer, light reflected by the first electrode 191 is partially re-reflected by the second electrode 193, so that a resonance structure is formed, thereby improving light extraction efficiency.

The thin film encapsulation 30 is formed on the second electrode 193 and covers the second electrode 193.

Since the organic light emitting diode (OLED) is very vulnerable to moisture and oxygen, the thin film encapsulation layer 30 closes and seals the organic light emitting diode OLED to thereby prevent permeation of external moisture and oxygen. The thin film encapsulation layer 30 may be formed of a multi-layer of an inorganic layer and an organic layer. The inorganic layer may include one of $Al_2O_3$, SiNx, and $SiO_x$. The organic layer may include any one of epoxy, acrylate, and urethane acrylate. Such a thin film encapsulation layer 30 is very thin so that it is advantageous for reducing the thickness of the display device and is appropriate for a flexible display device.

The thin film encapsulation layer 30 includes the organic layer and thus it can be planarized. The touch sensor 200 is disposed on the planarized thin film encapsulation layer 30.

For better understanding and ease of description, only the first conductive line CFL1 is shown in FIG. 7.

As shown in FIG. 7, the touch sensor 200 may include a substrate SUB that is disposed on the thin film encapsulation layer 30, an overcoat OC that is disposed on the substrate SUB, the first conductive line CFL1 that is disposed on the overcoat OC, the first insulation layer IL1 that is disposed on the overcoat OC and the first conductive line CFL1, and the second insulation layer IL2 that covers the first insulation layer IL1.

A method for manufacturing the touch sensor according to the exemplary embodiment will be described in detail with reference to FIG. 8 to FIG. 10.

Figure 8:
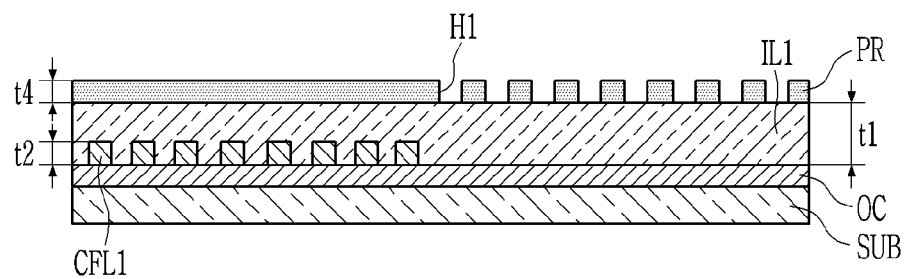
FIG. 8, FIG. 9, and FIG. 10 are cross-sectional views that sequentially illustrate a method for manufacturing the touch sensor according to the exemplary embodiment.
Figure 9:
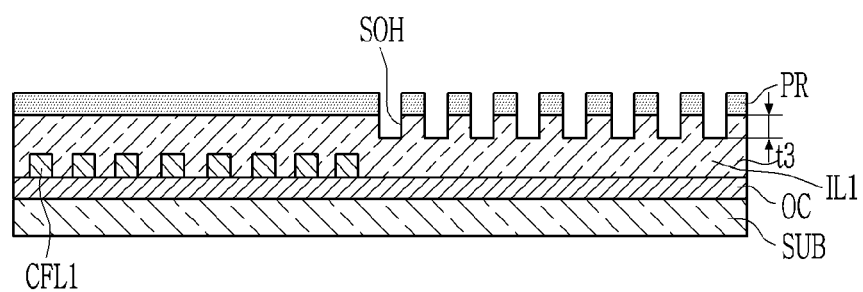
Figure 10:
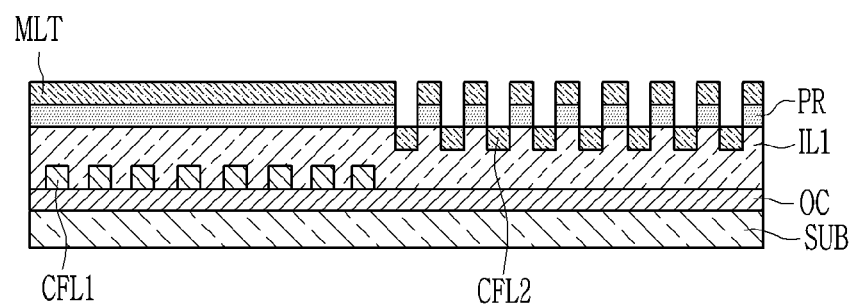

FIG. 8 to FIG. 10 are cross-sectional views that sequentially illustrate a method for manufacturing the touch sensor according to the exemplary embodiment.

As shown in FIG. 8, the overcoat OC is formed on the substrate SUB according to the manufacturing method of the touch sensor according to the exemplary embodiment. In addition, the plurality of first conductive lines CFL1 are formed as a first metal layer on the overcoat OC. The plurality of first conductive lines CFL1 form the first sense electrode 241.

In addition, the first insulation layer IL1 that covers the first conductive lines CFL1 is formed on the substrate SUB. Next, a photosensitive film PR is formed on the first insulation layer IL1. A thickness t4 of the photosensitive film PR may be smaller than the thickness t1 of the first insulation layer IL1. In addition, the photosensitive film PR is patterned such that a first opening portion H1 is formed.

Next, as shown in FIG. 9, the plurality of grooves SOH are formed on the upper portion of the first insulation layer IL1 by using the photosensitive film PR as a mask. The grooves SOH are provided at locations corresponding to the first opening portion H1. Since the thickness t4 of the photosensitive film PR is smaller than that of the first insulation layer IL1, the grooves SOH do not expose the overcoat OC.

Next, as shown in FIG. 10, a second metal layer MLT is formed on the photosensitive film PR. In this case, a part of the second metal layer MLT fills the grooves SOH of the first insulation layer IL1 through the first opening H1 of the photosensitive film PR. The part of the second metal layer MLT filled in the first insulation layer IL1 forms the plurality of second conductive lines CFL2. The plurality of second conductive lines CFL2 form the second sense electrode 242.

Next, as shown in FIG. 6, the photosensitive film PR and the second metal layer MLT are removed. Next, the second insulation layer IL2 is formed on the first insulation layer IL1.

In the exemplary embodiment shown in FIG. 1 to FIG. 6, the second conductive line does not contact the overcoat, but the second conductive line may contact the overcoat depending on exemplary embodiments.

Hereinafter, a touch sensor according to another exemplary embodiment will be described in detail.

Figure 11:
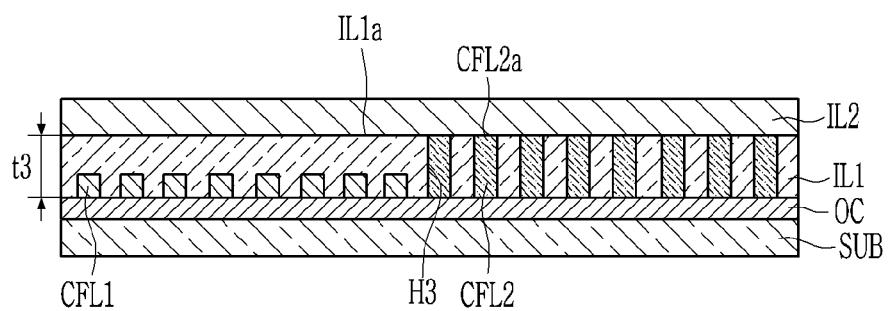
FIG. 11 is a partial cross-sectional view of a touch sensor according to another exemplary embodiment.

FIG. 11 is a partial cross-sectional view of a touch sensor according to another exemplary embodiment.

The exemplary embodiment shown in FIG. 11 is the same as the exemplary embodiment shown in FIG. 1 to FIG. 6, except for a thickness of a second conductive line. Therefore, a duplicated description will be omitted.

As shown in FIG. 11, an upper surface IL1a of a first insulation layer IL1 of the touch sensor according to the current exemplary embodiment may be disposed on the same plane as an upper surface CFL2a of a second conductive line CFL2.

The first insulation layer IL1 includes a plurality of through-holes H3 that connect an upper side and a lower side thereof. The second conductive line CFL2 may be disposed while filling the through-holes H3. Since the through-holes H3 penetrate the first insulation layer IL1, the second conductive lines CFL2 contact the overcoat OC disposed therebelow. Thus, the thickness t3 of the first insulation layer IL1 may be the same as that of the second sense electrode 242 that includes the second conductive line CFL2.

A method for manufacturing the touch sensor according to the other exemplary embodiment will now be described with reference to FIG. 11 to FIG. 13.

Figure 12:
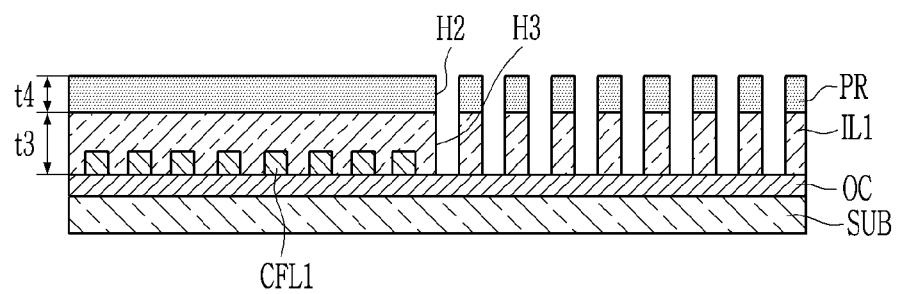
FIG. 12 and FIG. 13 are cross-sectional views of a method for manufacturing the touch sensor of FIG. 11.
Figure 13:
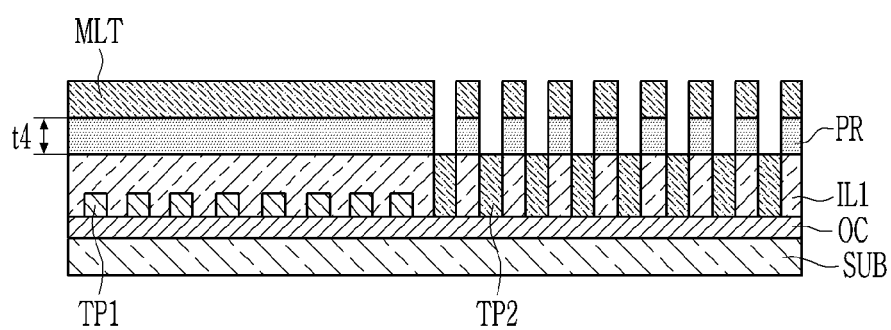

FIG. 12 and FIG. 13 are cross-sectional views that sequentially show a method for manufacturing the touch sensor of FIG. 11.

First, as shown in FIG. 12, the overcoat OC is formed on the substrate SUB. Next, the plurality of first conductive lines CFL1 are formed as a first metal layer on the overcoat OC. The plurality of first conductive lines CFL1 form the first sense electrode 241. In addition, the first insulation layer IL1 that covers the first conductive lines CFL1 is formed on the substrate SUB. Next, a photosensitive film PR is formed on the first insulation layer IL1. A thickness t4 of the photosensitive film PR may be greater than the thickness t3 of the first insulation layer IL1. The photosensitive film PR is patterned such that second openings H2 are formed. Next, through-holes H3 that penetrate the first insulation layer IL1 are formed using the photosensitive film PR as a mask. The through-holes H3 are disposed corresponding to the second openings H2 of the photosensitive film PR. Since the thickness t4 of the photosensitive film PR is greater than that thickness t3 of the first insulation layer IL1, the through-holes H3 that expose the overcoat OC are formed in the first insulation layer IL1.

Next, as shown in FIG. 13, a second metal layer MLT is formed on the photosensitive film PR. In this case, the second metal layer MLT is partially filled in the through-holes H3 of the first insulation layer IL1 through the second openings H2 of the photosensitive film PR. The part of the second metal layer MLT filled in the through-holes H3 of the first insulation layer IL1 forms the plurality of second conductive lines CFL2.

Next, as shown in FIG. 11, the photosensitive film PR and the second metal layer MLT are removed. Next, the second insulation layer IL2 is formed on the first insulation layer IL1.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A touch sensor comprising:
   a substrate;
   a first sense electrode that is disposed on the substrate and extends in a first direction;
   a first insulation layer that covers the substrate and the first sense electrode; and
   a second sense electrode that is disposed in the first insulation layer and extends in a second direction that crosses the first direction,
   wherein an upper surface of the second sense electrode is disposed on a same plane as an upper surface of the first insulation layer and a lower surface of the first sense electrode and a lower surface of the second sense electrode are disposed on a same plane as a lower surface of the first insulation layer,
   wherein a thickness of the first insulation layer is a same thickness as a thickness of the second sense electrode, and
   wherein the thickness of the second sense electrode is greater than a thickness of the first sense electrode.

2. The touch sensor of claim 1, further comprising a second insulation layer that covers the first insulation layer and the second sense electrode.

3. The touch sensor of claim 1, wherein the thickness of the first insulation layer is greater a thickness of the first sense electrode.

4. The touch sensor of claim 1, wherein the first sense electrode and the second sense electrode include a plurality of first conductive lines and a plurality of second conductive lines that are respectively connected with each other such that a mesh shape is formed, and upper surfaces of the plurality of second conductive lines are disposed on the same plane as the upper surface of the first insulation layer.

5. The touch sensor of claim 2, wherein an upper portion of the first insulation layer comprises a plurality of grooves, and a plurality of second conductive lines fills the grooves.

6. The touch sensor of claim 2, further comprising an overcoat that is disposed between the substrate and the first insulation layer,
wherein a plurality of second conductive lines does not contact the overcoat.

7. A display device comprising:
a display panel configured to display an image; and
a touch sensor that is disposed on the display panel,
wherein the touch sensor comprises:
a substrate,
a first sense electrode that is disposed on the display panel and extends in a first direction,
a first insulation layer that covers the substrate and the first sense electrode, and
a second sense electrode that is disposed in the first insulation layer and extends in a second direction that crosses the first direction,
wherein an upper surface of the second sense electrode is disposed on a same plane as an upper surface of the first insulation layer and a lower surface of the first sense electrode and a lower surface of the second sense electrode are disposed on a same plane as a lower surface of the first insulation layer,
wherein a thickness of the first insulation layer is a same thickness as a thickness of the second sense electrode, and
wherein the thickness of the second sense electrode is greater than a thickness of the first sense electrode.

8. The display device of claim 7, further comprising a second insulation layer that covers the first insulation layer and the second sense electrode.

9. The display device of claim 7, wherein the thickness of the first insulation layer is greater than a thickness of the first sense electrode.

10. The display device of claim 7, wherein the first sense electrode and the second sense electrode respectively comprise a plurality of first conductive lines and a plurality of second conductive lines that are respectively connected with each other such that a mesh shape is formed, and
upper surfaces of the plurality of second conductive lines are disposed on a same plane as the upper surface of the first insulation layer.

11. The display device of claim 8, wherein the upper surface of the first insulation layer comprises a plurality of grooves, and a plurality of second conductive lines fills the grooves.

12. The display device of claim 8, wherein the display panel comprises:
a display substrate;
a light emitting member that is disposed on the display substrate; and
a thin film encapsulation layer that covers the light emitting member, and
the touch sensor is disposed on the thin film encapsulation layer.

* * * * *